United States Patent
Ito et al.

(10) Patent No.: US 9,828,675 B2
(45) Date of Patent: Nov. 28, 2017

(54) PROCESSING APPARATUS AND PROCESSING METHOD

(71) Applicant: TOKYO ELECTRON LIMITED, Tokyo (JP)

(72) Inventors: Naohide Ito, Iwate (JP); Daisuke Morisawa, Yamanashi (JP); Keiji Osada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/860,251

(22) Filed: Sep. 21, 2015

(65) Prior Publication Data

US 2016/0093520 A1   Mar. 31, 2016

(30) Foreign Application Priority Data

Sep. 25, 2014 (JP) ................................. 2014-194917

(51) Int. Cl.
| | |
|---|---|
| *H01L 21/31* | (2006.01) |
| *C23C 16/458* | (2006.01) |
| *H01L 21/02* | (2006.01) |
| *H01L 21/67* | (2006.01) |
| *C23C 16/52* | (2006.01) |
| *H01L 21/677* | (2006.01) |

(52) U.S. Cl.
CPC .......... *C23C 16/4584* (2013.01); *C23C 16/52* (2013.01); *H01L 21/02263* (2013.01); *H01L 21/67201* (2013.01); *H01L 21/67745* (2013.01)

(58) Field of Classification Search
CPC ... C23C 14/564; C23C 14/568; H01L 21/673; H01L 21/677; H01L 21/67253
See application file for complete search history.

(56) References Cited

U.S. PATENT DOCUMENTS

| 7,640,072 B2 * | 12/2009 | Shimizu ............ H01L 21/67294 118/712 |
| 2010/0280643 A1 * | 11/2010 | Mochizuki ........ H01L 21/67276 700/99 |
| 2014/0370628 A1 * | 12/2014 | Sato ........................ C23C 16/52 438/16 |

FOREIGN PATENT DOCUMENTS

JP         2010-239102 A     10/2010

* cited by examiner

*Primary Examiner* — Syed Gheyas
(74) *Attorney, Agent, or Firm* — Abelman, Frayne & Schwab

(57) ABSTRACT

Disclosed is a processing apparatus. The processing apparatus includes: a load port in which a conveyance container accommodating a plurality of semiconductor wafers is placed; a dummy wafer storage area in which a conveyance container accommodating a plurality of dummy wafers is placed; a normal-pressure conveyance room in which a first conveyance arm is installed; an equipment that processes the plurality of semiconductor wafers in a state where the semiconductor wafers and the dummy wafers which are conveyed are placed in slots, respectively; and a controller that controls each component of the processing apparatus. The controller classifies the dummy wafers accommodated in the conveyance container into a plurality of groups, and controls the first conveyance arm to preferentially convey the dummy wafers within one of the classified groups to the equipment and, in replacing the dummy wafers, to perform replacement of the dummy wafers group to group as classified.

13 Claims, 9 Drawing Sheets

US 9,828,675 B2

PROCESSING APPARATUS AND PROCESSING METHOD

CROSS-REFERENCE TO RELATED APPLICATIONS

This application is based on and claims priority from Japanese Patent Application No. 2014-194917, filed on Sep. 25, 2014, with the Japan Patent Office, the disclosure of which is incorporated herein in its entirety by reference.

TECHNICAL FIELD

The present disclosure relates to a processing apparatus and a processing method.

BACKGROUND

As a processing apparatus that forms a thin film such as, for example, a silicon oxide film ($SiO_2$ film) on an object to be processed ("workpiece") such as, for example, a semiconductor wafer, a semi-batch type processing apparatus is known as disclosed in, for example, Japanese Patent Laid-Open Publication No. 2010-239102. In such a processing apparatus, a rotary table formed to be rotatable around a vertical axis is provided in a processing container that is maintained in vacuum, and a plurality of slots configured to place (accommodate) semiconductor wafers therein are formed on the rotary table along the circumferential direction thereof.

In addition, between the processing container and a load port in which a semiconductor wafer conveyance container (front opening unified pod (FOUP)) is placed, a transfer module, a load lock room, and a loader module are arranged from the processing container side. In addition, the semiconductor wafers within the FOUP are respectively accommodated in predetermined slots within a vacuum container through conveyance arms that are disposed in the transfer module and the loader module, respectively. Then, when a processing gas is supplied to the semiconductor wafers while revolving the semiconductor wafers by the rotary table, a uniform thin film is formed on the semiconductor wafers.

SUMMARY

A processing apparatus according to a first aspect of the present disclosure includes: a workpiece conveyance container placement section configured to place therein a workpiece conveyance container that accommodates a plurality of workpieces; a dummy workpiece placement section configured to place therein a dummy workpiece conveyance container that accommodates a plurality of dummy workpieces; a conveyance room in which a conveyance mechanism configured to convey the plurality of workpieces or the plurality of dummy workpieces is installed; a processing section configured to process the plurality of workpieces in a state where the plurality of workpieces or the plurality of dummy workpieces, conveyed by the conveyance mechanism installed in the conveyance room, are placed at predetermined positions, respectively; and a controller configured to control each component of the processing apparatus. The controller is configured to: classify the dummy workpieces accommodated in the dummy workpiece conveyance container into a plurality of groups, control the conveyance mechanism to preferentially convey the dummy workpieces within one of the classified groups to the processing section, and in replacing the dummy workpieces, perform replacement of the dummy workpieces group to group as classified.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
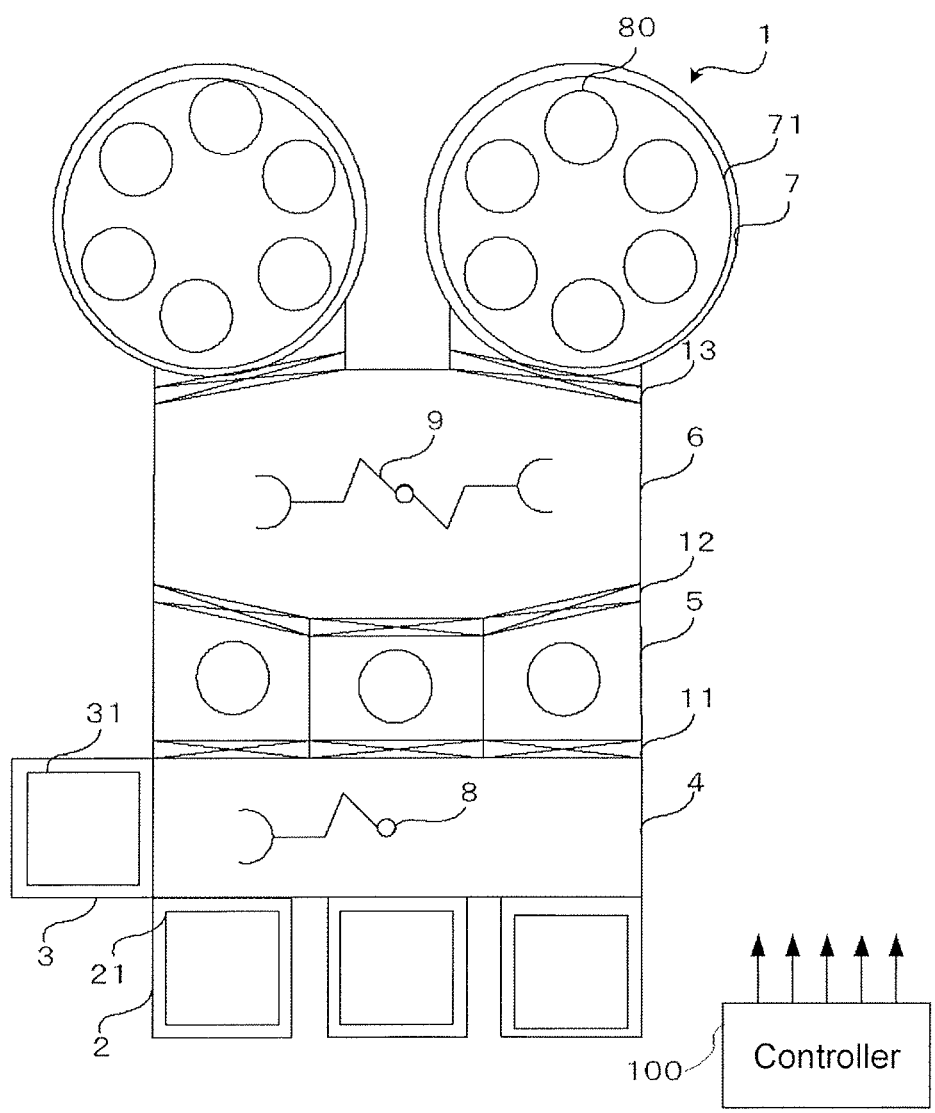
FIG. 1 is a schematic view illustrating a processing apparatus of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the film forming processing described above, when semiconductor wafers are not accommodated in all the slots on the rotary table, heat dissipation occurs in an empty slot so that a uniform thin film may not be formed on the accommodated semiconductor wafers. For this reason, the film forming processing is performed on the semiconductor wafers after a dummy wafer is accommodated in the empty slot such that the rotary table is in a state where no empty slot exists thereon.

Dummy wafers are accommodated in a dummy stocker that is placed in a load port. For example, one of three load ports may be set as a dummy wafer load port, and the dummy stocker may accommodate a predetermined number of (e.g., twenty five (25)) dummy wafers.

Here, replacement (exchange) of dummy wafers within the dummy stocker is performed for one FOUP, 25 dummy wafers and cannot be performed unless all the dummy wafers are accommodated within the dummy stocker. In addition, there is a problem in that when a dummy wafer is required in a film forming processing of semiconductor wafers at the time of replacing dummy wafers, a processing, such as, for example, the film forming processing, is stopped.

In consideration of the problems described above, an object of the present disclosure is to provide a processing apparatus and a processing method that enable replacement of wafers within a dummy stocker without affecting a main processing.

In order to achieve the object described above, a processing apparatus according to a first aspect of the present disclosure includes: a workpiece conveyance container placement section configured to place therein a workpiece conveyance container that accommodates a plurality of workpieces; a dummy workpiece placement section configured to place therein a dummy workpiece conveyance container that accommodates a plurality of dummy workpieces; a conveyance room in which a conveyance mechanism configured to convey the plurality of workpieces or the plurality of dummy workpieces is installed; a processing section configured to process the plurality of workpieces in a state where the plurality of workpieces or the plurality of dummy workpieces, conveyed by the conveyance mechanism installed in the conveyance room, are placed at predetermined positions, respectively; and a controller configured to control each component of the processing apparatus. The controller is configured to: classify the dummy workpieces accommodated in the dummy workpiece conveyance container into a plurality of groups, control the conveyance mechanism to preferentially convey the dummy workpieces within one of the classified groups to the processing section, and in replacing the dummy workpieces, perform replacement of the dummy workpieces group to group as classified.

For example, in replacing the dummy workpieces, the controller is configured to: control the conveyance mechanism to convey the dummy workpieces in a group that is not to be replaced to the processing section, and control the conveyance mechanism to perform the replacement of the dummy workpieces in a group that is to be replaced while controlling the processing section to execute a processing.

The processing section is configured to execute a thin film forming processing on, for example, the plurality of workpieces, and the controller is configured to specify the dummy workpieces in the group that is to be replaced based on a cumulative film thickness value of the dummy workpieces in the classified groups.

The processing section includes, for example, a rotary table including a plurality of placement regions formed along a peripheral direction thereof and configured to be rotatable around a vertical axis, and a processing gas supply unit configured to supply a processing gas for processing the workpieces to the placement regions. The workpieces or the dummy workpieces are placed in the plurality of placement regions, respectively, and the controller is configured to control the processing gas supply unit to supply the processing gas to the placement regions while rotating the rotary table around the vertical axis.

A processing method according to a second aspect of the present disclosure uses a processing apparatus including: a workpiece conveyance container placement section configured to place therein a workpiece conveyance container that accommodates a plurality of workpieces; a dummy workpiece placement section configured to place therein a dummy workpiece conveyance container that accommodates a plurality of dummy workpieces; a conveyance room in which a conveyance mechanism configured to convey the plurality of workpieces or the plurality of dummy workpieces is installed, a processing section configured to process the plurality of workpieces in a state where the plurality of workpieces or the plurality of dummy workpieces, conveyed by the conveyance mechanism installed in the conveyance room, are placed at predetermined positions, respectively. The dummy workpieces accommodated in the dummy workpiece conveyance container are classified into a plurality of groups, and the dummy workpieces within one of the classified groups are preferentially conveyed to the processing section, and in replacing the dummy workpieces, replacement of the dummy workpieces is performed group to group as classified.

In replacing the dummy workpieces, the dummy workpieces in a group not to be replaced may be conveyed to the processing section, and the replacement of the dummy workpieces in the group that is to be replaced may be performed while controlling the processing section to execute a processing.

In the processing section, a processing to form a thin film on the plurality of workpieces may be executed, and the dummy workpieces in the group to be replaced may be specified based on a cumulative film thickness value of the dummy workpieces in the classified groups.

The processing section may include: a rotary table including a plurality of placement regions formed along a peripheral direction thereof and configured to be rotatable around a vertical axis; and a processing gas supply unit configured to supply a processing gas to process the workpieces to the placement regions. The workpieces or the dummy workpieces may be placed in the plurality of placement regions, respectively, and the processing gas may be supplied to the placement regions while rotating the rotary table around the vertical axis.

According to the present disclosure, it is possible to provide a processing apparatus and a processing method that enable replacement of wafers within a dummy stocker without affecting a processing.

Hereinafter, a processing apparatus and a processing method of the present disclosure will be described with reference to the accompanying drawings. In addition, in the present exemplary embodiment, descriptions will be made on a case in which a processing apparatus 1 illustrated in FIG. 1 is used as the processing apparatus of the present disclosure, as an example.

As illustrated in FIG. 1, the processing apparatus 1 includes a plurality of (three in the present exemplary embodiment) load ports 2, each serving as a workpiece conveyance container placement section, a dummy wafer storage area 3 serving as a dummy workpiece placement section, a normal-pressure conveyance room 4, a load lock room 5, a vacuum conveyance room 6, and a plurality of (two in the present exemplary embodiment) chambers 7.

The load ports 2 refer to spaces that are arranged adjacent to the normal-pressure conveyance room 4 so as to carry a workpiece such as, for example, a semiconductor wafer, into or out of the processing apparatus 1. In each of the load ports 2, a conveyance container (front opening unified pod (FOUP)) 21 is placed. The FOUP 21 is capable of accommodating and conveying a plurality of semiconductor wafers. In the present exemplary embodiment, three load ports 2 are provided side by side and are configured such that the conveyance container 21 may be placed in each port.

Figure 2:
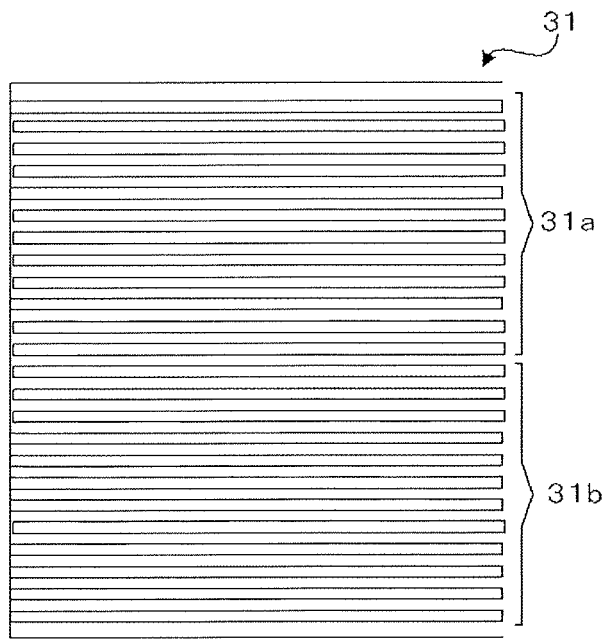
FIG. 2 is a view illustrating an outline of a conveyance container.

The dummy wafer storage area 3 refers to a space that is arranged adjacent to the normal-pressure conveyance room 4 separately from the load ports 2 so as to carry in or carry out a dummy wafer. In the dummy wafer storage area 3, a conveyance container 31 is placed. The conveyance container 31 is capable of accommodating and conveying a plurality of dummy wafers. FIG. 2 illustrates an outline of the conveyance container 31. As illustrated in FIG. 2, the conveyance container 31 is formed to be capable of accommodating a plurality of dummy wafers in the vertical direction. The dummy wafers accommodated in the conveyance container 31 are classified into a plurality of groups. In the present exemplary embodiment, the conveyance container 31 is divided into two groups such that twelve dummy wafers are accommodated in the upper group 31a, and twelve dummy wafers are accommodated in the lower group 31b.

The normal-pressure conveyance room 4 interconnects the load ports 2 and the load lock rooms 5. In addition, the normal-pressure conveyance room 4 interconnects the dummy wafer storage area 3, the load ports 2, and the load lock rooms 5. A first conveyance arm 8 is mounted in the normal-pressure conveyance room 4. The first conveyance arm 8 is configured as, for example, a conveyance arm that is constituted with an articulated arm, and carries the semiconductor wafers into or out of the load ports 2 or the load lock rooms 5. In addition, the first conveyance arm 8 carries the dummy wafers into or out of the load ports 2, the dummy wafer storage area 3, or the load lock rooms 5.

The load lock rooms 5 refer to a space that interconnects the normal-pressure conveyance room 4 and the vacuum conveyance room 6 so as to carry the semiconductor wafers into or out of the normal-pressure conveyance room 4 or the vacuum conveyance room 6. The load lock rooms 5 are connected with the normal-pressure conveyance room 4 through gates 11, and connected with the vacuum conveyance room 6 through gates 12. In addition, the load lock rooms 5 are connected to a vacuum control unit 123 to be described later which is constituted with, for example, a vacuum pump and a valve so that the indoor atmosphere of the load lock rooms 5 may be switched to an atmospheric pressure condition or a vacuum state. For this reason, in the load lock rooms 5, when a semiconductor wafer or a dummy wafer is carried into a load lock room 5, the indoor atmosphere of the load lock room 5 is changed from the atmospheric pressure to the vacuum state. In addition, after the inside of the load lock room 5 is set to the vacuum state, the semiconductor wafer or the dummy wafer is carried into the vacuum conveyance room 6 from the load lock room 5. In addition, when the semiconductor wafer or the dummy wafer is carried out from the load lock room 5, the indoor atmosphere is changed from the vacuum state to the atmospheric pressure so as to set the inside of the load lock room 5 to the atmospheric pressure condition, and then the semiconductor wafer or the dummy wafer is carried out of the load lock room 5 to the normal-pressure conveyance room 4.

The vacuum conveyance room 6 connects the load lock rooms 5 to each chamber 7. The vacuum conveyance room 6 is connected to each chamber 7 through the gate 13. In addition, the vacuum conveyance room 6 is connected to a vacuum control unit (not illustrated) which is constituted with, for example, a vacuum pump and a valve, and the indoor atmosphere of the vacuum conveyance room 6 is maintained in the vacuum state.

In addition, in the vacuum conveyance room 6, a second conveyance arm 9 is mounted. The second conveyance arm 9 is configured as a conveyance arm constituted with, for example, an articulated arm, and carries the semiconductor wafers into or out of each chamber 7 or each load lock room 5. In addition, the second conveyance arm 9 carries the dummy wafers into or out of each chamber 7 or each load lock room 5.

Figure 3:
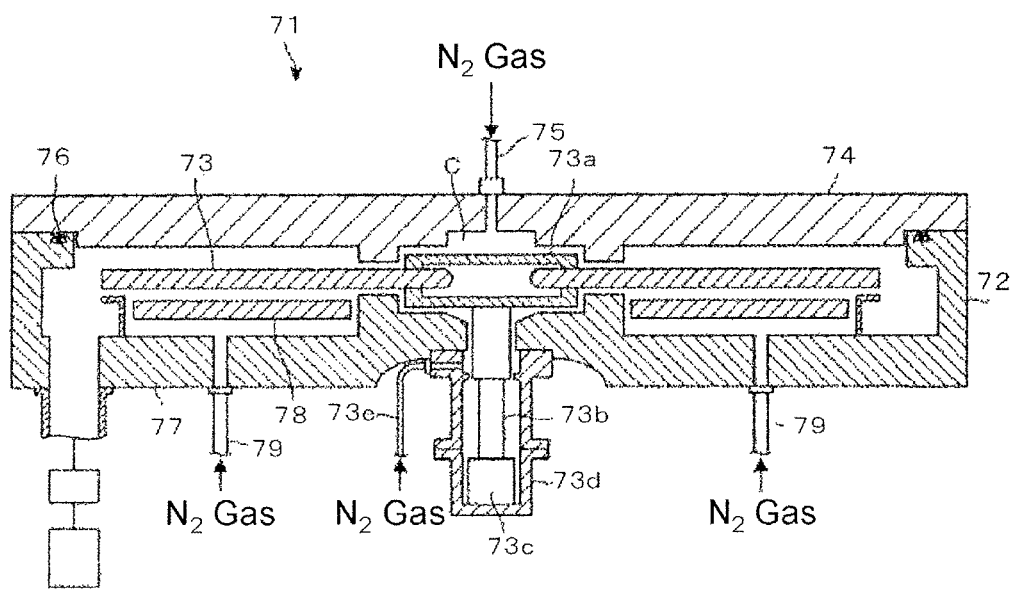
FIG. 3 is a view illustrating an example of an equipment accommodated in a chamber.

In each chamber 7, various equipments, each corresponding to a processing using the processing apparatus 1 of the present disclosure, for example, a film forming apparatus that forms a thin film on the semiconductor wafers, are mounted. The processing using the processing apparatus 1 of the present disclosure refers to a processing that processes a plurality of semiconductor wafers as workpieces and uses dummy wafers in the processing. FIG. 3 illustrates an example of an equipment mounted in the chamber 7.

As illustrated in FIG. 3, the equipment 71 includes a vacuum container 72 having a substantially circular shape in a plan view, and a rotary table 73 having a rotation center at the center of the vacuum container 72. A separation gas supply pipe 75 configured to supply nitrogen ($N_2$) gas is connected to the central portion of the top side of the top plate 74 of the vacuum container 72 in order to prevent different processing gases from being mixed with each other in the central region C of the vacuum container 72. Between the vacuum container 72 and the top plate 74, a seal member 76 constituted with, for example, an O-ring, is disposed. In addition, between the bottom 77 of the vacuum container 72 and the rotary table 73, a heater unit 78 is provided. In addition, a purge gas supply pipe 79 is provided in order to purge the space in which the heater unit 78 is disposed.

The rotary table 73 is fixed to a substantially cylindrical core unit 73a at the central portion thereof, and is configured to be rotatable around a vertical axis by a rotary shaft 73b that is connected to the bottom surface of the core unit 73a and extends in the vertical direction. In addition, the rotary table 73 is equipped with a driving unit 73c that rotates the rotary shaft 73b around the vertical axis, and a case body 73d that accommodates the rotary shaft 73b and the driving unit 73c. To the case body 73d, a purge gas supply pipe 73e is connected so as to supply nitrogen gas to the bottom side region of the rotary table 73 as a purge gas.

On the surface of the rotary table 73, recessed slots (placement regions) 80, each of which is configured to hold a semiconductor wafer or a dummy wafer, are provided. The slots 80 are formed at a plurality of locations, for example, six locations, along the rotating direction (circumferential direction) of the rotary table 73. In a location that faces the passing region of each slot 80, a plurality of nozzles (not illustrated) are arranged radially, and connected to each of processing gas supply sources (not illustrated) through a flow rate control valve. In addition, a thin film is formed on the surface of a semiconductor wafer by the processing gases supplied from the nozzles.

Figure 4:
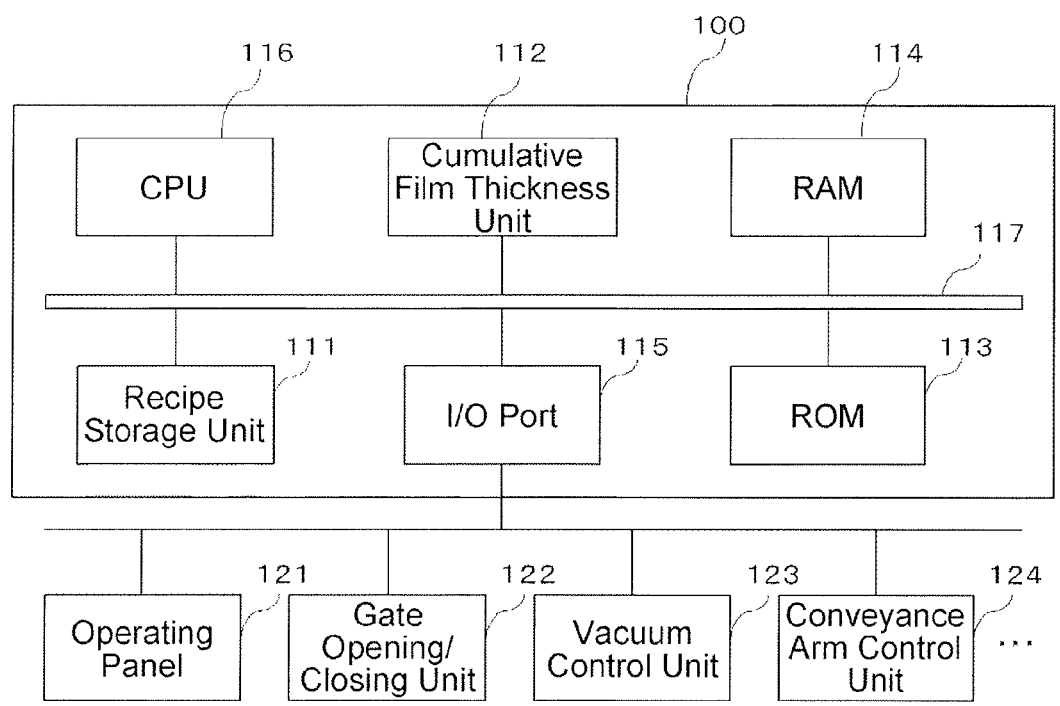
FIG. 4 is a view illustrating a configuration of a controller.

In addition, the processing apparatus 1 includes a controller 100 configured to control each component of the processing apparatus 1. FIG. 4 illustrates a configuration of the controller 100. As illustrated in FIG. 4, to the controller 100, for example, an operating panel 121, a gate opening/closing unit 122, a vacuum control unit 123, and a conveyance arm control unit 124 are connected.

The operating panel 121 includes a display screen and an operation button to deliver an operating instruction of an operator to the controller 100 and to display various pieces of information from the controller 100 on the display screen.

The gate opening/closing unit 122 is configured to control the opened/closed condition of the gates 11 to 13 in response to an instruction from the controller 100, and notifies the condition of the controller 100.

The vacuum control unit 123 controls the inside of the load lock rooms 5, the vacuum conveyance room 6, and the chambers 7 to a vacuum state in response to an instruction from the controller 100, and notifies the condition of the controller 100.

The conveyance aim control unit 124 controls the operation of the first conveyance arm 8 and the second conveyance arm in response to an instruction from the controller 100.

In addition, the controller 100 includes a recipe storage unit 111, a cumulative film thickness unit 112, a read only memory (ROM) 113, a random access memory (RAM) 114, an input/output (I/O) port 115, and a central processing unit (CPU) 116, and a bus 117 that interconnects these components.

The recipe storage unit 111 is stored with a plurality of process recipes. A process recipe refers to a recipe that is prepared for each processing (process) that is practically performed by the user. The process recipes define a temperature change and a pressure change of each component, timing of starting and stopping supply of various gases, and a supply amount of the gases from loading of semiconductor wafers to unloading of completely processed semiconductor wafers with respect to the processing apparatus 1.

The cumulative film thickness unit 112 is stored with, for example, a current cumulative film thickness value of each dummy wafer accommodated in the conveyance container 31 of the dummy wafer storage area 3, and a prescribed cumulative film thickness of a dummy wafer. The current cumulative film thickness value of a dummy wafer refers to a total film thickness deposited to the dummy wafer. For example, when a dummy wafer has been used three times in a processing that forms a thin film of 30 nm on a semiconductor wafer, the current cumulative film thickness value is 90 nm (30×3=90 nm). In addition, the prescribed cumulative film thickness value of a dummy wafer refers to a value that indicates a replacement timing of a used dummy wafer. When the current cumulative film thickness value exceeds this value, for example, particles are likely to be generated and a problem is caused in a film forming processing.

The ROM 113 is constituted with, for example, an electrically erasable programmable read only memory (EE-PROM), a flash memory, and a hard disc, and is a recording medium that stores, for example, an operating program of the CPU 116. The RAM 114 functions as, for example, a work area of the CPU 116.

The I/O port 115 is connected to, for example, the gate opening/closing unit 122, the vacuum control unit 123, and the conveyance arm control unit 124 so as to control input/output of data or signals.

The CPU 116 forms a backbone of the controller 100, and executes a control program stored in the ROM 113. In addition, the CPU 116 controls the operation of the processing apparatus 1 according to the recipes (process recipes) stored in the recipe storage unit 111 in response to an instruction from the operating panel 121. The bus 117 delivers information between respective units.

Figure 5:
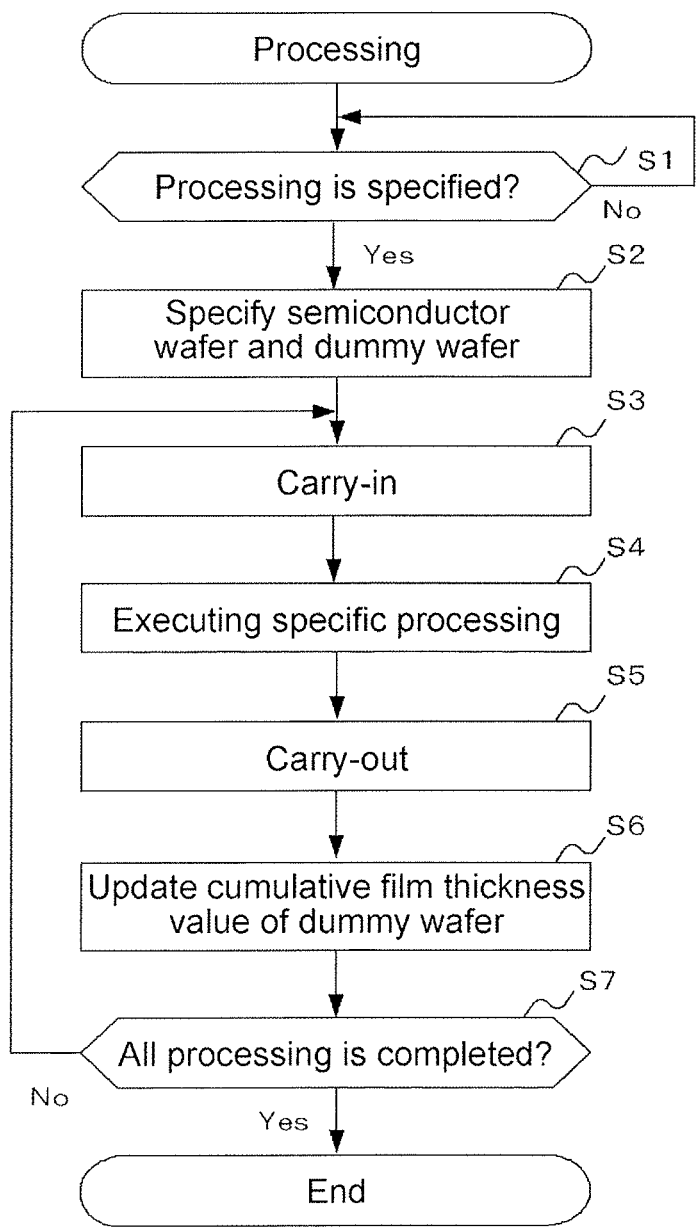
FIG. 5 is a flowchart for describing a processing method of the present disclosure.

Next, a processing method using the processing apparatus 1 configured as described above will be described with reference to a drawing. FIG. 5 is a flowchart for describing the processing method of the present disclosure. In the following description, the operation of each component that forms the processing apparatus 1 is controlled by the controller 100 (CPU 116).

First, the CPU 116 determines whether a processing content (a recipe stored in the recipe storage unit 111) is specified or not (step S1). That is, the CPU 116 determines whether or not an operator of the processing apparatus 1 has operated the operating panel 121 so that the processing content is specified.

When it is determined that the processing content is specified (step S1: YES), the CPU 116 specifies a semiconductor wafer to be processed and a dummy wafer to be used for the processing (step S2). For example, the CPU 116 specifies a semiconductor wafer on which the processing is to be performed from the non-processed semiconductor wafers accommodated in the conveyance container 21 of a load port 2, and at the same time, specifies a dummy wafer to be used for the processing from the dummy wafers accommodated in the conveyance container 31 of the dummy wafer storage area 3.

Figure 6:
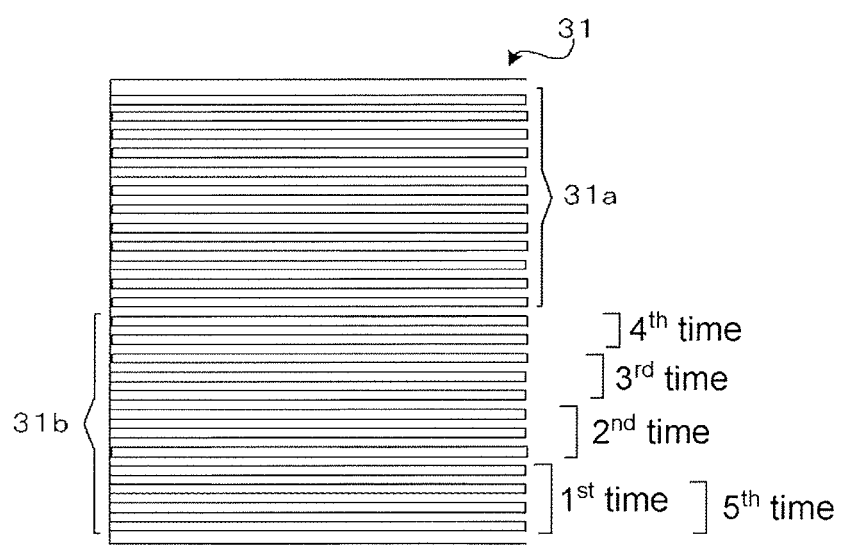
FIG. 6 is a view for describing how dummy wafers to be used in a processing are specified.

Here, in the present exemplary embodiment, since the dummy wafers accommodated in the conveyance container 31 are classified into two groups, the dummy wafers to be used are specified from the dummy wafers accommodated in one of the classified groups, for example, the lower group 31b. For example, when a specific processing should be performed five times in total, respective dummy wafers to be used at first time to fifth time are specified as illustrated in FIG. 6.

Next, the CPU 116 carries the specific semiconductor wafers and the dummy wafers into the slots 80 of the equipments 71 disposed in the chambers 7 (step S3). Hereinafter, descriptions will be made on a case in which at this point in time, the gates 11 to 13 are closed, the normal-pressure conveyance room 4 and the load lock rooms 5 are in the normal pressure state, and the vacuum conveyance room 6 and the chambers 7 are in the vacuum state, by way of an example.

First, the CPU 116 controls the conveyance arm control unit 124 to operate the first conveyance arm 8 so as to convey specific semiconductor wafers within a conveyance container 21 accommodated in a load port 2, and at the same time, controls the gate opening/closing unit 122 to open a gate 11 so as to convey the conveyed semiconductor wafers to a predetermined position in a load lock room 5. In addition, the CPU 116 controls the conveyance arm control unit 124 to operate the first conveyance arm 8 so as to convey specific dummy wafers within the conveyance container 31 accommodated in the dummy wafer storage area 3, and at the same time, controls the gate opening/closing unit 122 to open the gate 11 so as to convey the conveyed dummy wafers to a predetermined position in the load lock room 5.

Next, the CPU 116 controls the gate opening/closing unit 122 to close the gate 11, and then controls the vacuum control unit 123 to set the inside of the load lock room 5 to the vacuum state. Subsequently, the CPU 116 controls the gate opening/closing unit 122 to open the gate 12 and the gate 13, and then controls the conveyance arm control unit 124 to operate the second conveyance arm 9 so as to accommodate the semiconductor wafers conveyed to the load lock room 5 in the slots 80 at predetermined positons in the equipment 71 disposed in the chamber 7. In the same manner, the dummy wafers are also accommodated in the slots 80 at predetermined positions in the equipment 71 disposed in the chamber 7.

Subsequently, the CPU 116 controls the gate opening/closing unit 122 to close the gate 13, and then controls each component of the processing apparatus 1 according to a specific process recipe so as to execute a specific processing (step S4). That is, a film forming processing of semiconductor wafers is executed so as to form a uniform thin film on the semiconductor wafers by supplying a processing gas to the semiconductor wafers while revolving the semiconductor wafers by the rotary table 73.

When the film forming processing of the semiconductor wafers is terminated, the CPU 116 carries the film-formed semiconductor wafers and the used dummy wafers out of the equipment 71 (slots 80) disposed in the chamber 7 (step S5).

More specifically, the CPU 116 controls the gate opening/closing unit 122 to open the gate 13 and the gate 12, and then controls the conveyance arm control unit 124 to operate the second conveyance arm 9 so as to convey the film-formed semiconductor wafers to the load lock room 5. In the same manner, the used dummy wafers are also conveyed to the load lock room 5.

Next, the CPU 116 controls the gate opening/closing unit 122 to close the gate 12, and controls the vacuum control unit 123 to set the inside of the load lock room 5 to the normal pressure state. When the inside of the load lock room 5 is set to the normal pressure state, the CPU 116 controls the gate opening/closing unit 122 to open the gate 11, and then controls the conveyance arm control unit 124 to operate the first conveyance arm 8 so as to accommodate the semiconductor wafers conveyed to the inside of the load lock room 5 at a predetermined position of the conveyance container 21 accommodated in the load port 2.

In addition, the CPU 116 controls the conveyance arm control unit 124 to operate the first conveyance arm 8 so as to accommodate the dummy wafers conveyed into the load lock room 5 to predetermined positions in the conveyance container 31 accommodated in the dummy wafer storage area 3. Then, the CPU 116 calculates the cumulative film thickness value of the dummy wafers accommodated in the dummy wafer storage area 3, and stores (updates) the calculated cumulative film thickness values of the dummy wafers in the cumulative film thickness unit 112 (step S6).

Subsequently, the CPU 116 determines whether all the processing is completed (step S7). When it is determined that all the processing is not completed (step S7: No), the CPU 116 returns to step S3 and carries specific semiconductor wafers and specific dummy wafers into the slots 80 of the equipment 71 disposed in the chamber 7. Meanwhile, when it is determined that all the processing is completed (step S7: Yes), the CPU 116 terminates the processing.

Figure 7:
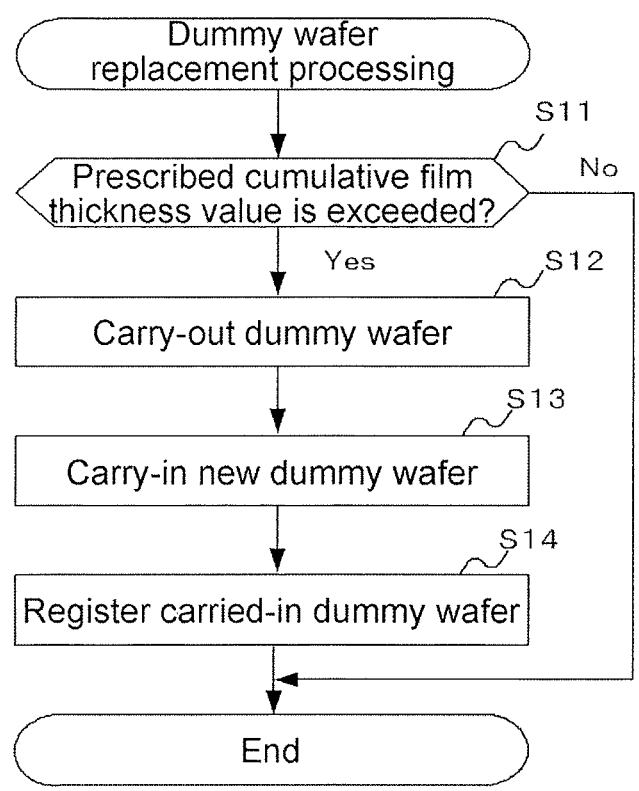
FIG. 7 is a flowchart for describing a dummy wafer replacement processing.
Figure 8A:
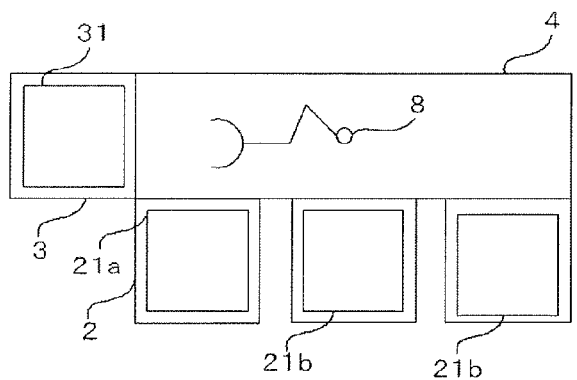
FIGS. 8A and 8B are views for describing replacement of dummy wafers.
Figure 8B:
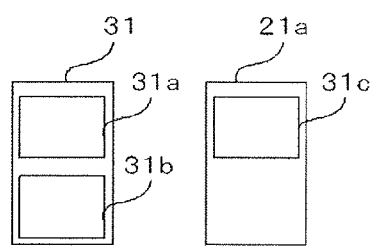
Figure 9A:
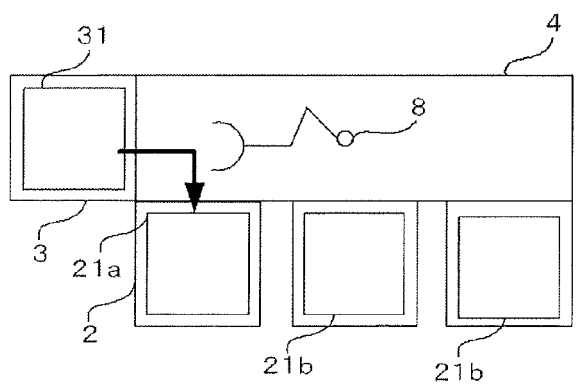
FIGS. 9A and 9B are views for describing replacement of dummy wafers.
Figure 9B:
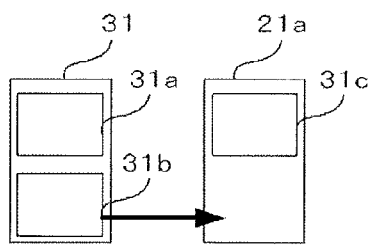
Figure 10A:
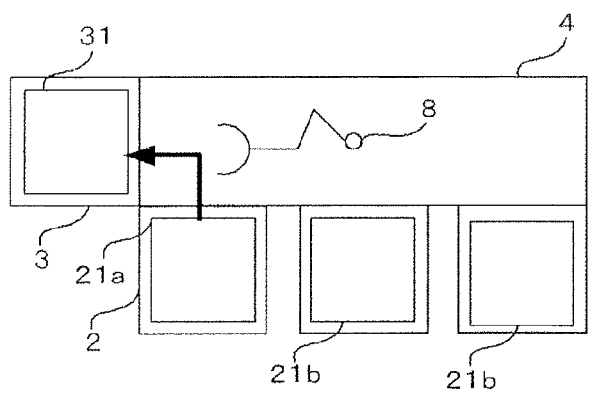
FIGS. 10A and 10B are views for describing replacement of dummy wafers.
Figure 10B:
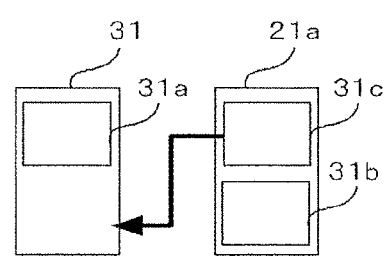

When such a processing is repeated plural times, the thin film is deposited to the dummy wafer, which may cause a problem in that particles may occur in a film forming processing. For this reason, when the cumulative film thickness on a used dummy wafer exceeds a prescribed cumulative film thickness value, a dummy wafer replacement processing is executed to replace the dummy wafers accommodated in the conveyance container 31. FIG. 7 is a flowchart for describing a dummy wafer replacement processing. In addition, FIGS. 8 to 11 are views for describing a dummy wafer replacement processing. In the present exemplary embodiment, descriptions will be made of a case in which dummy wafers accommodated in the lower group 31b of a conveyance container 31 is replaced with dummy wafers accommodated in a conveyance container 21a in a load port 2, by way of an example.

First, the CPU 116 determines whether the dummy wafers accommodated in the conveyance container 31 exceeds a prescribed cumulative film thickness value or not (step S11). When it is determined that the dummy wafers accommodated in the conveyance container 31 do not exceed the prescribed cumulative film thickness value (step S11: No), the CPU 116 terminates the processing.

When it is determined that the dummy wafers accommodated in the conveyance container 31 exceed the prescribed cumulative film thickness value (step S11: Yes), the CPU 116 controls the conveyance arm control unit 124 to operate the first conveyance arm 8 so as to carry out the dummy wafers of the group in which the dummy wafers exceeding the prescribed cumulative film thickness value are included (the lower group 31b) to the conveyance container 21a of the load port 2 (step S12). That is, the CPU 116 accommodates the dummy wafers of the lower group 31b in the conveyance container 21a of the load port 2 by the first conveyance arm 8 from the state illustrated in FIG. 8, as illustrated by arrow in FIG. 9.

Figure 11A:
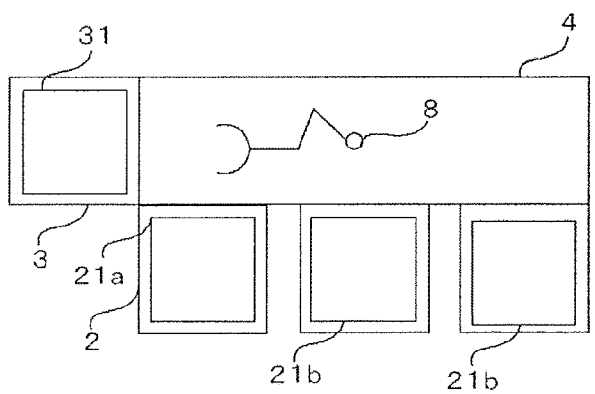
FIGS. 11A and 11B are views for describing replacement of dummy wafers.
Figure 11B:
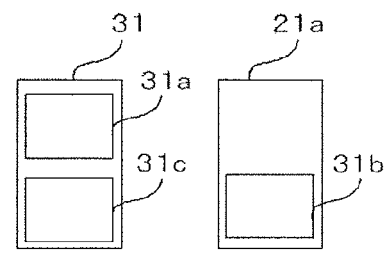

Next, the CPU 116 controls the conveyance arm control unit 124 to operate the first conveyance arm 8 so as to carry new dummy wafers into the conveyance container 31 (step S13). That is, the CPU 116 carries the new dummy wafers accommodated in the conveyance container 21a of the load port 2 into the conveyance container 31 by the first conveyance arm 8, as illustrated by arrow in FIG. 10. As a result, as illustrated in FIG. 11, the dummy wafers exceeding the prescribed cumulative film thickness value may be replaced with the new dummy wafers.

Here, since the dummy wafer storage area 3, in which the conveyance container 31 that accommodates dummy wafers is stored, is provided separately from the load ports 2, the replacement of dummy wafers may be performed without affecting the processing of semiconductor wafers. In addition, since the dummy wafers accommodated in the conveyance container 31 are classified into a plurality of groups, the replacement of dummy wafers may be performed even if all the dummy wafers are not accommodated in the conveyance container 31. For this reason, by performing the replacement of dummy wafers when the first conveyance arm 8 is not used, for example during the processing by the equipment 71, the replacement of dummy wafers within the conveyance container 31 is enabled without adversely affecting a processing, for example, without stopping a processing, such as a film forming processing.

Subsequently, the CPU 116 registers each of the replaced (carried-in) dummy wafers in the cumulative film thickness unit 112 (step S14), and terminates the processing.

As described above, according to the present exemplary embodiment, since the dummy wafer storage area 3 is provided separately from the load ports 2, the replacement of dummy wafers may be performed without affecting the processing of semiconductor wafers.

In addition, according to the present exemplary embodiment, since the dummy wafers accommodated in the conveyance container 31 are classified into a plurality of groups, the replacement of dummy wafers may be performed without affecting the processing of semiconductor wafers.

Various modifications and applications may be made to the present disclosure without being limited to the exemplary embodiments described above. Hereinafter, other exemplary embodiments applicable to the present disclosure will be described.

Figure 12:
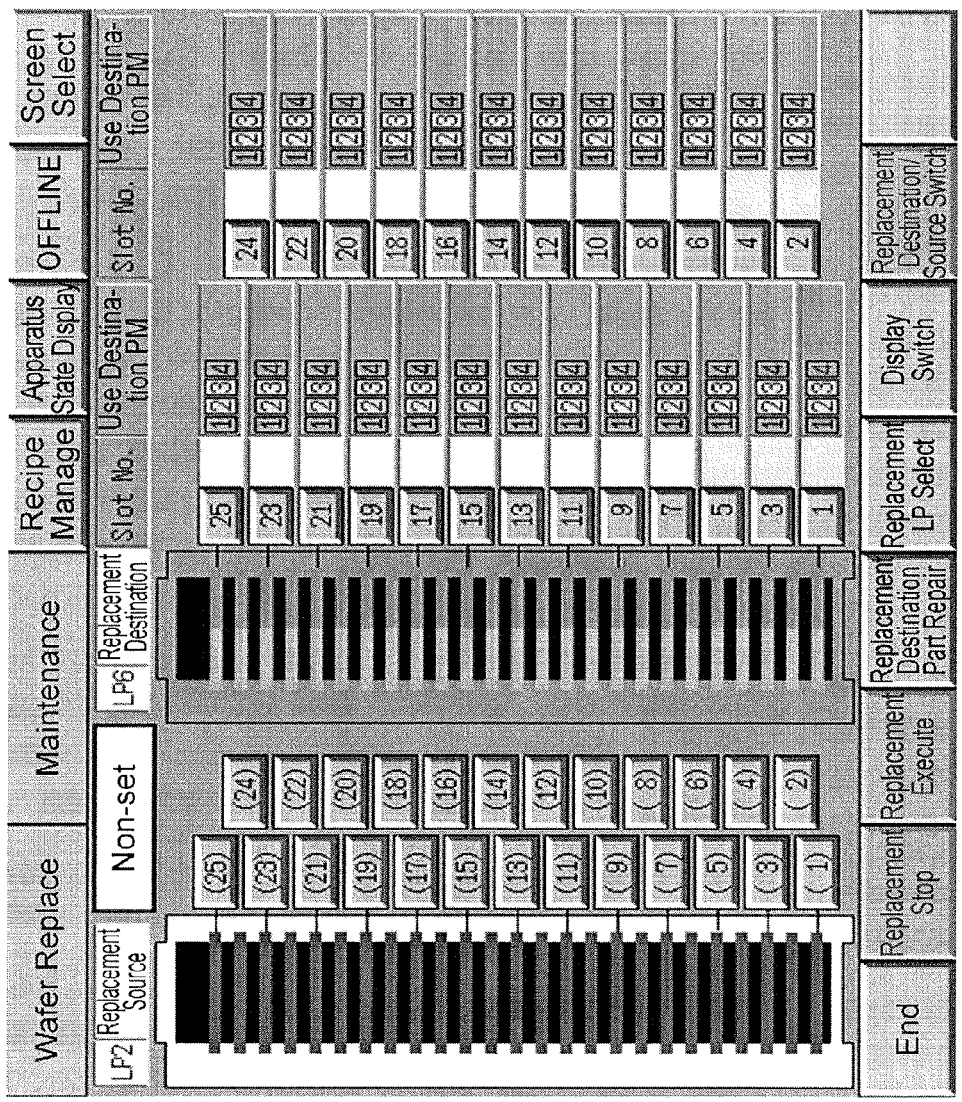
FIG. 12 is a view illustrating an exemplary display screen of an operating panel.

In the foregoing exemplary embodiments, the present disclosure has been described with reference to a case in which dummy wafers are replaced through a dummy wafer replacement processing, by way of an example. However, for example, as illustrated in FIG. 12, the current situation of dummy wafers accommodated in a conveyance container 31 may be displayed on a display screen of the operating panel 121. In such a case, since an operator of the processing apparatus may easily confirm the current situation of the dummy wafers displayed on the operating panel 121, the operator may operate the operating panel 121 so as to perform the replacement of dummy wafers.

In the display screen of the operating panel 121 which displays the current situation of dummy wafers, the dummy wafers that exceed the prescribed cumulative film thickness value or the dummy wafers in the vicinity of the prescribed cumulative film thickness value may be distinguished by color or highlighted. In addition, the dummy wafers may be classified into groups, and the groups may be distinguished by colors. This may facilitate determination as to whether to replace the dummy wafers.

In the exemplary embodiment, the present disclosure has been described with reference to a case in which the dummy wafers are replaced based on the prescribed cumulative film thickness value, by way of an example. However, the dummy wafers may be replaced based on various standards according to processing contents. In addition, when the processing contents are related to forming a thin film on semiconductor wafers, the dummy wafers may be replaced based on the prescribed cumulative film thickness value.

In the exemplary embodiment described above, although the present disclosure has been described with reference to a processing apparatus 1 that includes a normal-pressure conveyance room 4, a load lock room 5, and a vacuum conveyance room 6 by way of an example, the processing apparatus may be any one that is able to perform various processings on a plurality of semiconductor wafers using dummy wafers, and the present disclosure may be applied to various processing apparatuses. In addition, in the exemplary embodiment described above, the present disclosure has been described with reference to a processing apparatus 1 that includes two chambers 7 by way of an example. However, the number of the chambers 7 may be one, or three or more.

In the exemplary embodiment described above, the present disclosure has been described with reference to a case in which semiconductor wafers are used as workpieces by way of an example. However, the workpieces are not limited to the semiconductor wafers and may be, for example, substrates for a liquid crystal display device.

The present disclosure is suitable for a processing apparatus and a processing method that use a dummy workpiece in processing a workpiece.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A processing apparatus, comprising:
a plurality of workpiece conveyance container placement sections each configured to place therein a workpiece conveyance container configured to accommodate a plurality of workpieces to be processed;
a dummy workpiece placement section located separately from the plurality of workpiece conveyance container placement sections and configured to place therein a dummy workpiece conveyance container that accommodates a plurality of dummy workpieces of same kind;
a conveyance room in which a conveyance mechanism configured to convey the plurality of workpieces or the plurality of dummy workpieces is installed;
a processing section configured to process the plurality of workpieces in a state where the plurality of workpieces and dummy workpieces conveyed by the conveyance mechanism installed in the conveyance room are placed at predetermined positions, respectively; and
a controller configured to control each component of the processing apparatus,
wherein the controller is programmed to divide the dummy workpieces in the dummy workpiece conveyance container into a plurality of groups,
control the conveyance mechanism to independently convey the dummy workpieces in a unit of group of the plurality of groups in the dummy workpiece conveyance container through a first dummy workpiece path formed between the dummy workpiece conveyance container and predetermined positions of the processing section, and
independently perform a replacement of the dummy workpieces in a unit of group of the plurality of groups in the dummy workpiece conveyance container through a second dummy workpiece path formed between the workpiece conveyance container containing new dummy workpieces and the dummy workpiece conveyance container while the workpieces placed at the predetermined positions of the processing section are being processed.

2. The processing apparatus of claim 1, wherein, in replacing the dummy workpieces, the controller is configured to: control the conveyance mechanism to convey the dummy workpieces in a group that is not to be replaced, to the processing section, and control the conveyance mechanism to perform the replacement of the dummy workpieces in a group that is to be replaced while controlling the processing section to execute a processing.

3. The processing apparatus of claim 1, wherein the processing section is configured to execute a thin film forming processing on the plurality of workpieces, and
the controller is configured to specify the dummy workpieces in the group to be replaced based on a cumulative film thickness value of the dummy workpieces in the classified groups.

4. The processing apparatus of claim 1, wherein the processing section includes:
a rotary table including a plurality of placement regions formed along a peripheral direction thereof and being configured to be rotatable around a vertical axis, the plurality of workpieces or the plurality of dummy workpieces being placed in the plurality of placement regions, respectively; and
a processing gas supply unit configured to supply a processing gas to process the workpieces to the placement regions, and
wherein the controller is configured to control the processing gas supply unit to supply the processing gas to the placement regions while rotating the rotary table around the vertical axis.

5. The processing apparatus of claim 1, wherein the plurality of workpiece conveyance container placement sections are arranged side by side in a row.

6. The processing apparatus of claim 5, wherein the dummy workpiece placement section is arranged out of the row along which the plurality of workpiece conveyance container placement sections are arranged.

7. A processing method that uses a processing apparatus including: a plurality of workpiece conveyance container placement sections each configured to place therein a workpiece conveyance container configured to accommodate a plurality of workpieces to be processed; a dummy workpiece placement section configured to place therein a dummy workpiece conveyance container that accommodates a plurality of dummy workpieces of same kind; a conveyance room in which a conveyance mechanism configured to convey the workpieces or the dummy workpieces is installed; a processing section configured to process the plurality of workpieces in a state where the plurality of workpieces or the plurality of dummy workpieces, conveyed by the conveyance mechanism installed in the conveyance room, are placed at predetermined positions, respectively; and a controller configured to control each component of the processing apparatus, the method comprising:

dividing, by the controller, the dummy workpieces accommodated in the dummy workpiece conveyance container into a plurality of groups, selecting, by the controller, the dummy workpieces of one of the plurality of groups in the dummy workpiece conveyance container;

conveying, by the controller, the dummy workpieces within one of the plurality of groups selected at the selecting into the processing section through a first dummy workpiece path formed between the dummy workpiece conveyance container in the dummy workpiece placement section and respective predetermined positions of the processing section, and replacing the dummy workpieces in the dummy workpiece conveyance container in a unit of group of the plurality of groups through a second dummy workpiece path formed between the workpiece conveyance container containing new dummy workpieces and the dummy workpiece conveyance container in the dummy workpiece placement section while the workpieces placed at the predetermined positions of the processing section are being processed.

8. The processing method of claim 7, wherein, in replacing the dummy workpieces, the dummy workpieces in a group that is not to be replaced are conveyed to the processing section, and the replacement of the dummy workpieces in a group that is to be replaced is performed while controlling the processing section to execute a processing.

9. The processing method of claim 7, wherein, in the processing section, a processing to form a thin film on the plurality of workpieces is executed, and the dummy workpieces in the group that is to be replaced is specified based on a cumulative film thickness value of the dummy workpieces in the classified groups.

10. The processing method of claim 7, wherein the processing section includes: a rotary table including a plurality of placement regions formed along a peripheral direction thereof and being configured to be rotatable around a vertical axis, the plurality of workpieces or the plurality of dummy workpieces being placed in the plurality of placement regions, respectively; and a processing gas supply unit configured to supply a processing gas to process the workpieces to the placement regions, and the processing gas is supplied to the placement regions while rotating the rotary table around the vertical axis.

11. The processing method of claim 7, wherein the plurality of workpiece conveyance container placement sections are arranged side by side in a row.

12. The processing method of claim 11, wherein the dummy workpiece placement section is arranged out of the row along which the plurality of workpiece conveyance container placement sections are arranged.

13. A processing apparatus, comprising:

a plurality of load ports each configured to place therein a wafer conveyance container configured to accommodate a plurality of semiconductor wafers to be processed;

a dummy wafer storage area located separately from the plurality of workpiece conveyance container placement sections and configured to place therein a dummy wafer conveyance container that accommodates a plurality of dummy wafers of same kind;

a conveyance room in which a conveyance mechanism configured to convey the semiconductor wafers or the dummy wafers is installed;

a processing chamber configured to process the semiconductor wafers in a state where the semiconductor wafers and dummy wafers conveyed by the conveyance mechanism installed in the conveyance room are placed at predetermined positions, respectively; and a controller configured to control each component of the processing apparatus, wherein the controller is programmed to divide the dummy workpieces in the dummy workpiece conveyance container into a plurality of groups, control the conveyance mechanism to independently convey the dummy workpieces in a unit of group of the plurality of groups in the dummy workpiece conveyance container through a first dummy workpiece path formed between the dummy workpiece conveyance container and predetermined positions of the processing section, and independently perform a replacement of the dummy workpieces in a unit of group of the plurality of groups in the dummy workpiece conveyance container through a second dummy workpiece path formed between the workpiece conveyance container containing new dummy workpieces and the dummy workpiece conveyance container while the workpieces placed at the predetermined positions of the processing section are being processed.

\* \* \* \* \*